(12) United States Patent
Pyun et al.

(10) Patent No.: US 11,622,447 B2
(45) Date of Patent: *Apr. 4, 2023

(54) DISPLAY DEVICE AND DRIVING METHOD THEREOF

(71) Applicant: Samsung Display Co., LTD., Yongin-si (KR)

(72) Inventors: Ki Hyun Pyun, Gwangmyeong-si (KR); Myoung Seop Song, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/827,283

(22) Filed: May 27, 2022

(65) Prior Publication Data

US 2022/0295636 A1 Sep. 15, 2022

Related U.S. Application Data

(63) Continuation of application No. 17/375,850, filed on Jul. 14, 2021, now Pat. No. 11,350,528.

(30) Foreign Application Priority Data

Oct. 29, 2020 (KR) ........................ 10-2020-0142036

(51) Int. Cl.
*H05K 1/14* (2006.01)
*G09G 3/32* (2016.01)

(52) U.S. Cl.
CPC ............... *H05K 1/147* (2013.01); *G09G 3/32* (2013.01); *G09G 2310/08* (2013.01);
(Continued)

(58) Field of Classification Search
None
See application file for complete search history.

(56) References Cited

U.S. PATENT DOCUMENTS 5,797,177 A 8/1998 Simmons et al.
5,812,210 A 9/1998 Arai et al.
(Continued)

FOREIGN PATENT DOCUMENTS

KR 100471785 B1 7/2005
KR 100495810 B1 9/2005
(Continued)

*Primary Examiner* — Fred Tzeng
(74) *Attorney, Agent, or Firm* — Cantor Colburn LLP

(57) ABSTRACT

A display device includes: a display panel including a plurality of pixels; a first flexible printed circuit board attached to the display panel and electrically connected thereto; a first printed circuit board attached to the first flexible printed circuit board and electrically connected thereto; a data driver which applies a data voltage to the plurality of pixels, receives a voltage flowing to the plurality of pixels and generates mobility sensing information based on the voltage flowing to the plurality of pixels; and a timing controller which detects a first misalignment between the first printed circuit board and the first flexible printed circuit board, and a second misalignment between the display panel and the first flexible printed circuit board, based on the mobility sensing information.

9 Claims, 7 Drawing Sheets

(52) U.S. Cl.
    CPC ... *G09G 2330/028* (2013.01); *G09G 2330/12* (2013.01); *H05K 2201/10128* (2013.01)

(56) References Cited

U.S. PATENT DOCUMENTS

| | | |
|---|---|---|
| 6,271,480 B1 | 8/2001 | Yamaguti et al. |
| 9,591,781 B2 | 3/2017 | Vanderveen et al. |
| 10,354,569 B2 * | 7/2019 | Choi .................... G06F 3/1431 |
| 2008/0054910 A1 | 3/2008 | Lee et al. |
| 2018/0188290 A1 | 7/2018 | Park et al. |
| 2018/0226005 A1 | 8/2018 | Choi et al. |
| 2018/0301830 A1 | 10/2018 | Hoyack et al. |

FOREIGN PATENT DOCUMENTS

| | | |
|---|---|---|
| KR | 1020180025038 A | 3/2018 |
| KR | 101931336 B1 | 12/2018 |
| KR | 101971139 B1 | 4/2019 |
| KR | 1020200025620 A | 3/2020 |
| KR | 102115461 B1 | 5/2020 |

\* cited by examiner

DISPLAY DEVICE AND DRIVING METHOD THEREOF

This application is a continuation of U.S. patent application Ser. No. 17/375,850, filed on Jul. 14, 2021, which claims priority to Korean Patent Application No. 10-2020-0142036, filed on Oct. 29, 2020, and all the benefits accruing therefrom under 35 U.S.C. § 119, the content of which in its entirety is herein incorporated by reference.

BACKGROUND (a) Field

Embodiments of the invention relates to a display device and a driving method thereof. More particularly, embodiments of the invention relate to a display device that detects a manufacturing failure therein, and a driving method thereof.

(b) Description of the Related Art

Currently, display deice, such as a liquid crystal display ("LCD") and a light emitting display device, are widely used in various fields. The LCD may include a backlight unit, and display an image by transmitting or blocking light emitted from the backlight unit. Since the light emitting display device has a self-emissive characteristic, the light emitting display device does not use a separate light source.

A plurality of pixels included in the light emitting display respectively include light emitting diodes and driving transistors connected to the light emitting diodes. The driving transistor transmits a current corresponding to an applied data voltage to the light emitting diode such that the light emitting diode emits light with luminance corresponding to the data voltage.

SUMMARY

In a manufacturing process of a display device, a process for attaching a flexible printed circuit board that includes a data driver to a display panel, and attaching a printed circuit board that is also referred to as a source-printed board assembly ("S-PBA") to the flexible printed circuit board may be performed.

When a misalignment occurs during such a process, the data driver and the display panel may be burnt due to an overcurrent.

Embodiments according to the invention are directed to a display device that detects misalignment in a process for attaching a display panel, a flexible printed circuit board and a printed circuit board to one another, and a driving method thereof.

An embodiment of a display device according to the invention includes: a display panel including a plurality of pixels; a first flexible printed circuit board attached to the display panel and electrically connected thereto; a first printed circuit board attached to the first flexible printed circuit board and electrically connected thereto; a data driver which applies a data voltage to the plurality of pixels, receives a voltage flowing to the plurality of pixels and generates mobility sensing information based on the voltage flowing to the plurality of pixels; and a timing controller which detects a first misalignment between the first printed circuit board and the first flexible printed circuit board, and a second misalignment between the display panel and the first flexible printed circuit board, based on the mobility sensing information.

In an embodiment, the timing controller may output an error detection signal indicating an occurrence of an error when one of the first misalignment and the second misalignment is detected, and the timing controller may stop outputting of a scan signal applied to the plurality of pixels in response to the error detection signal.

In an embodiment, the display device further includes a power supply which supplies a power to the display device and turns off the power in response to the error detection signal.

In an embodiment, the timing controller may include: a frame memory which stores mobility sensing information per block for a block of the display panel corresponding to the data driver; a sensing analyzing portion which analyzes mobility distribution per block for the block based on the mobility sensing information; and a defective line analyzing portion which analyzes mobility distribution per line for every data line connected to the data driver.

In an embodiment, the sensing analyzing portion may determine that the first misalignment occurs in the block when the mobility distribution per block is higher than a predetermined sensing allowable value.

In an embodiment, the defective line analyzing portion may determine that the second misalignment occurs when a case where the mobility distribution per line is higher than a predetermined sensing allowable value occurs only in a specific line.

In an embodiment, the timing controller may further include a line retest portion which re-performs mobility measurement for the specific line.

In an embodiment, the timing controller may further include a monitoring portion which outputs misalignment information including location information of a data driver where misalignment occurs along with information on the first misalignment.

In an embodiment, the monitoring portion may output misalignment information including location information of a data line where misalignment occurs along with information on the second misalignment.

According to another embodiment of the invention, a driving method of a display device, which includes a display panel including a plurality of pixels, a first flexible printed circuit board attached to the display panel and electrically connected thereto, a first printed circuit board attached to the first flexible printed circuit board and electrically connected thereto, and a data driver which applies a data voltage to the plurality of pixels, receives a voltage flowing to the plurality of pixels and generates mobility sensing information based on the voltage flowing to the plurality of pixels is provided. In such an embodiment, the driving method includes: analyzing mobility distribution per block for a block of the display panel corresponding to the data driver; determining that a first misalignment between the first printed circuit board and the first flexible printed circuit board occurs when the mobility distribution per block is higher than a predetermined sensing allowable value; and analyzing mobility distribution per line for every data line connected to the data driver corresponding to the block where the first misalignment occurs, and determining whether a second misalignment between the display panel and the first flexible printed circuit board occurs.

In an embodiment, the driving method of the display device may further include when the mobility distribution per block is lower than the sensing allowable value, determining that no misalignment occurs in the block and performing a normal driving for displaying an image.

In an embodiment, the driving method of the display device may further include, when it is determined that the first misalignment occurs, generating block defect information including location information of the block or location information of the data driver corresponding to the block.

In an embodiment, when a case where the mobility distribution per line is higher than the sensing allowable value occurs in all data lines in the block, it may be determined that the first misalignment occurs.

In an embodiment, the driving method of the display device may further include outputting alignment defect information including location information of the block where the first misalignment occurs or location information of the data driver corresponding to the block, along with information on the first misalignment, to the outside.

In an embodiment, the driving method of the display device may further include estimating the second misalignment and generating first line defect information when a case where the mobility distribution per line is higher than the sensing allowable value occurs only in a specific data line in the block where the first misalignment occurs.

In an embodiment, the driving method of the display device may further include generating second line defect information by retesting mobility with respect to a pixel connected to the specific data line where the second misalignment occurs.

In an embodiment, the driving method of the display device may further include comparing the first line defect information and the second line defect information and outputting the first line defect information when the first line defect information and the second line defect information are equal to each other.

In an embodiment, it may be determined that the second misalignment occurs in response to the output first line defect information.

In an embodiment, the driving method of the display device may further include outputting an error detection signal indicating an occurrence of an error when one of the first misalignment and the second misalignment is detected, and stopping outputting of a scan signal applied to the plurality of pixels according to the error detection signal.

In an embodiment, the driving method of the display device may further include turning off a power supplied to the display device in response to the error detection signal.

In embodiments of the invention, as set forth herein, a misalignment is detected in a process for attaching a display panel, a flexible printed circuit board, and a printed circuit board to one another, such that a data driver and a display panel may be effectively prevented from being burnt due to an overcurrent. In such embodiments, the misalignment is detected during a manufacturing process of the display device, thereby improving manufacturing efficiency of the display device.

DETAILED DESCRIPTION

Figure 1:
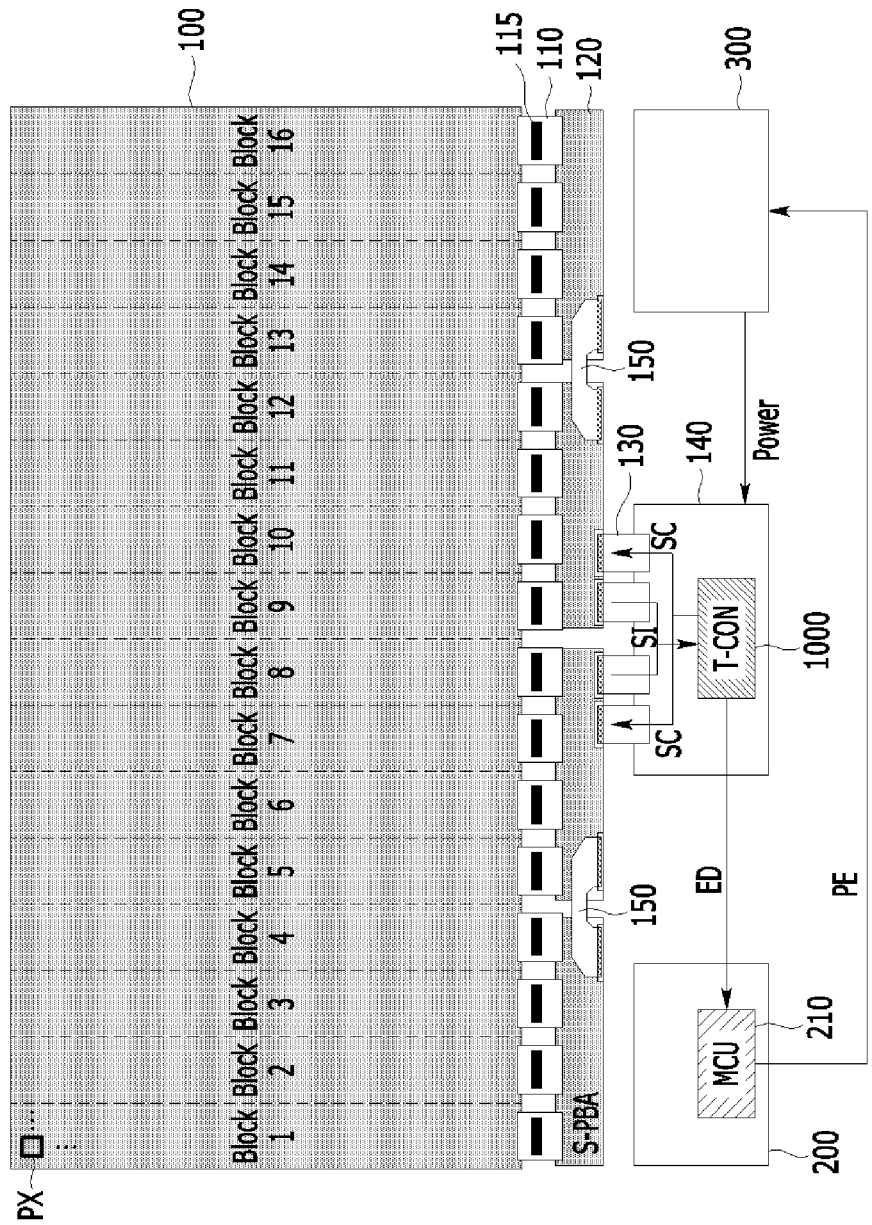
FIG. 1 schematically illustrates a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 schematically illustrates a display device according to an embodiment of the invention.

Referring to FIG. 1, an embodiment of a display device according to the invention may include a display panel 100, flexible printed circuit boards 110, 130, and 150, printed circuit boards 120 and 140, a data driver 115, and a timing controller ("T-CON" in FIG. 1) 1000. In such an embodiment, the display device may include a main board 200 that includes a microcontroller unit ("MCU" in FIG. 1) that controls overall functions of the display device, and a power supply 300 that supplies power to the display device. The power supply 300 may be a module-type switching mode power supply ("SMPS") that converts an alternating current ("AC") voltage to a voltage suitable for various devices or elements of the display device.

The display panel 100 includes a plurality of pixels PX. The display panel 100 may be a liquid crystal display panel that includes liquid crystals, or a light emitting display panel that includes a light emitting element. In an embodiment, the display panel 100 shown in FIG. 1 may be a medium or large display panel.

The plurality of pixels PX included in the display panel 100 are controlled based on various control signals that include a scan signal and a data voltage, and may receive a power voltage having a constant voltage level.

Hereinafter, embodiments where the display panel 100 is a light emitting display panel will be described in detail for convenience of description. In the light emitting display panel, the plurality of pixels PX may receive a data voltage and at least one scan signal, and may also receive a driving voltage, which is a power voltage, and a driving low-voltage. In the light emitting display panel, an output current of a driving transistor is determined based on the data voltage, and light is emitted as the output current flows through a light emitting diode. Luminance of light emitted by the light emitting diode is determined based on the intensity of the current flowing through the light emitting diode.

In an embodiment, the display panel 100 includes a scan driver (not shown) that generates the scan signal. In an embodiment, the scan driver is included in the display panel 100 by being mounted in some regions of the display panel 100. In an embodiment, the scan driver may be formed together with the plurality of pixels PX through a process for forming the plurality of pixels PX.

In an embodiment, the data driver 115 that applies the data voltage is provided or formed on a first flexible printed circuit board 110, and the timing controller 1000 is provided or formed on a second printed circuit board 140. The second printed circuit board 140 may be referred to as a control-printed board assembly ("control-PBA"). The timing controller 1000 generates an image data signal and a control signal based on an externally input image signal, and the data driver 115 receives an image data signal from the timing controller 1000 and controls the received signal to a data voltage to be applied to the plurality of pixels PX.

In an embodiment, a control signal (i.e., a data control signal) for a data driver among control signals output from the timing controller 1000 and the image data signal are transmitted to the data driver 115 on the first flexible printed circuit board 110 through the second printed circuit board 140, the second flexible printed circuit board 130, and the first printed circuit board 120.

In such an embodiment, a control signal for a scan driver (i.e., a scan control signal) SC among the control signals output from the timing controller 1000 is transmitted to the scan driver on the display panel 100 through the second printed circuit board 140, the second flexible printed circuit board 130, the first printed circuit board 120, and the first flexible printed circuit board 110.

In an embodiment, as shown in FIG. 1, four first printed circuit boards 120 are provided, and are positioned in pairs, for example. The paired two first printed circuit boards 120 are electrically connected by the third flexible printed circuit board 150. Accordingly, a signal output from the timing controller 1000 is applied to a first pair of the first printed circuit boards 120 after passing through the second printed circuit board 140 and the first printed circuit board 120, and then transmitted to a second pair of the first printed circuit boards 120 through the third flexible printed circuit board 150.

In an embodiment of FIG. 1, a total of 16 first flexible printed circuit boards 110 and a total of 16 data drivers 115 are included. The 16 data drivers 115 may be mounted on the 16 first flexible printed circuit boards 110 in the form of integrated circuit ("IC") chips, and the data driver 115 in the form of an IC chip is referred to as "D-IC". In such an embodiment, the timing controller 1000 may be mounted on the second printed circuit board 140 in the form of an IC chip.

The display panel 100, the flexible printed circuit boards 110, 130, and 150, and the printed circuit boards 120 and 140 may be attached to each other by an anisotropic conductive film ("ACF") and thus may be electrically connected to each other.

In an alternative embodiment, the display device may include only a single flexible printed circuit board and a single printed circuit board. In such an embodiment, the timing controller 1000 is formed on the printed circuit board, and the data driver 115 may be formed by being attached onto the flexible printed circuit board or to an area at one side of the display panel 100.

In an embodiment, as illustrated in FIG. 1, the display panel 100 is divided into a plurality of blocks. In such an embodiment, such a block is not a physically divided block, but a block conceptually classified based on the plurality of pixel PX driven by the data driver 115 and the timing controller 1000. Each block corresponds to a single data driver 115, and the display panel 100 may include a total of 16 blocks in a row direction, as shown in FIG. 1. In an embodiment of FIG. 1, the number of blocks is the same as the number of data drivers 115 and the number of first flexible printed circuit boards 110. The number of the divided blocks may be variously modified. Hereinafter, embodiments in which a total number of blocks is 16 will be described for convenience of description.

Each of the plurality of pixels PX includes a light emitting diode and a driving transistor connected to the light emitting diode, and the timing controller 1000 may measure mobility of a driving transistor included in each pixel PX to compensate for deterioration of the driving transistors and a threshold voltage deviation between the driving transistors. A data voltage is compensated based on the measured mobility such that image quality deterioration due to deterioration of the driving transistors and the threshold voltage deviation between the driving transistors may be effectively prevented. Such a method is referred to as an external compensation.

In an embodiment, the timing controller 1000 may measure mobility of the plurality of pixels PX until an image is output from after the display device is powered on using a same method as the external compensation, which is referred to as an on-sensing. In the on-sensing, each data driver 115 applies a predetermined voltage to pixels PX included in a corresponding block, and receives a voltage flowing through the pixel PX over time. The data driver 115 converts variation of the voltage flowing through the pixel over time into a digital signal to generate mobility sensing information SI. The mobility sensing information SI is transmitted to the timing controller 1000 on the second printed circuit board 140 after passing through the first flexible printed circuit board 110, the first printed circuit board 120, and the second flexible printed circuit board 130. That is, the mobility sensing information SI of each block may be transmitted to the timing controller 1000.

In an embodiment, the timing controller 1000 may detect misalignment between the display panel 100 and the first flexible printed circuit board 110 and misalignment between the first printed circuit board 120 and the first flexible printed circuit board 110 based on the measured mobility sensing information SI.

Hereinafter, misalignment between the display panel 100 and the first flexible printed circuit board 110 will be referred to as a first misalignment, and misalignment between the first printed circuit board 120 and the first flexible printed circuit board 110 will be referred to as a second misalignment.

When one of the first misalignment and the second misalignment is detected, the timing controller 1000 outputs an error detection signal ED that indicates error occurrence. The timing controller 1000 stops outputting of the scan signal SC in response to the error detection signal ED that indicates error occurrence to prevent an image from being displayed. The timing controller 1000 outputs the error detection signal ED that indicates error occurrence to the MCU 210 of the main board 200, and the MCU 210 outputs a power signal PE that instructs power-off in response to the error detection signal ED to the power supply 300. The power supply 300 turns off power supplied to the display device in response to the power signal PE that instructs power-off.

In such an embodiment, as described, when the first misalignment or the second misalignment occurs, the output of the scan signal SC is stopped and the display device is powered-off.

When the display device is driven to display an image in the state of first misalignment or second misalignment, the data driver 115 and the display panel 100 may be burnt due to overcurrent and may fail.

However, in an embodiment of the invention, a burn failure may be effectively prevented primarily by detecting misalignment in on-sensing and stopping the output of the scan signal SC so that the image is not displayed. In such an embodiment, secondary burnt failure may be further prevented by power-off of the display device, and it takes time to discharge the power.

Hereinafter, referring to FIG. 2 and FIG. 3, a pixel PX that performs on-sensing, and the data driver 115 that performs on-sensing, will be described.

Figure 2:
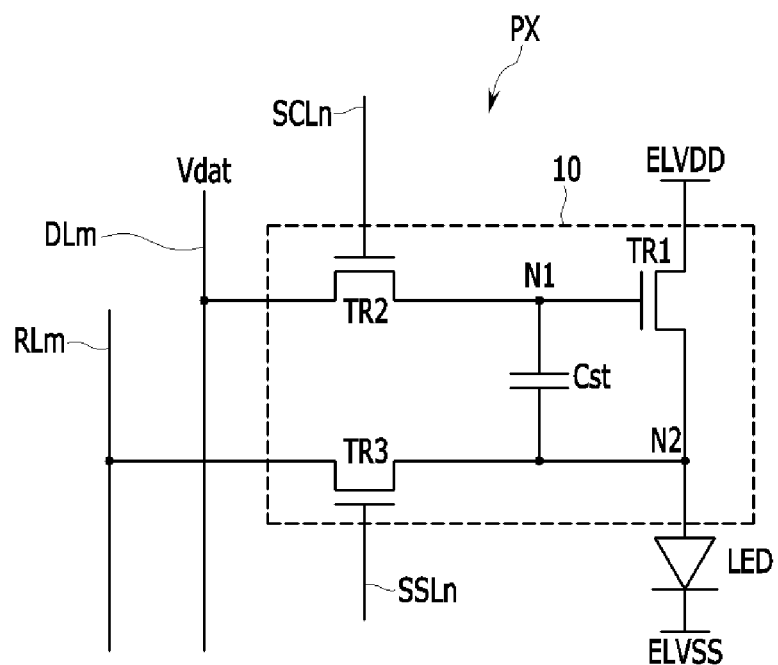
FIG. 2 is a circuit diagram that indicates a pixel according to an embodiment of the invention.

FIG. 2 is a circuit diagram that indicates a pixel according to an embodiment of the invention. In such an embodiment, the plurality of pixels may have substantially the same structure as each other. For convenience of illustration and description, FIG. 2 shows a pixel PX disposed in an n-th pixel row and an m-th pixel column among the plurality of pixels included in the display device of FIG. 1, and any repetitive detailed description of other pixels will be omitted.

Referring to FIG. 2, an embodiment of a pixel PX includes a light emitting diode LED and a pixel circuit 10.

The pixel circuit 10 is configured to control a current flowing to the light emitting diode LED from a first power voltage ELVDD. The pixel circuit 10 may include a driving transistor TR1, a switching transistor TR2, a sensing transistor TR3, and a storage capacitor Cst.

The driving transistor TR1 includes a gate electrode connected to a first node N1, a first electrode to which the first power voltage ELVDD is applied, and a second electrode connected to a second node N2. The driving transistor TR1 is connected between the first power voltage ELVDD and the light emitting diode LED, and controls a current flowing to the light emitting diode LED from the first power voltage ELVDD based on a voltage of the first node N1.

The switching transistor TR2 includes a gate electrode connected to a scan line SCLn, a first electrode connected to a data line DLm, and a second electrode connected to the first node N1. The switching transistor TR2 is connected between the data line DLm and the driving transistor TR1, and transmits a data voltage Vdat, which is applied to the data line DLm when being turned on by a scan signal of a gate-on voltage applied to the scan line SCLn, to the first node N1.

The sensing transistor TR3 includes a gate electrode connected to a sensing line SSLn, a first electrode connected to the second node N2, and a second electrode connected to a receiving line RLm. The sensing transistor TR3 is connected between the second electrode of the driving transistor TR1 and the receiving line RLm, and is turned on by a sensing signal of a gate-on voltage applied to the sensing signal and transmits a current flowing to the light emitting diode LED through the driving transistor TR1 to the receiving line RLm. In such an embodiment, the receiving line RLm may be a wire that transmits an initialization voltage to the second node N2. As the initialization voltage is applied to the second node N2 through the receiving line RLm, an anode voltage of the light emitting diode LED may be initialized.

In an embodiment, the driving transistor TR1, the switching transistor TR2, and the sensing transistor TR3 may be n-channel field effect transistors. A gate-on voltage that turns on the n-channel field effect transistor is a high-level voltage, and a gate-off voltage that turns off the n-channel field effect transistor is a low-level voltage. Alternatively, at least one of the driving transistor TR1, the switching transistor TR2, and the sensing transistor TR3 may be a p-channel field effect transistor. A gate-on voltage that turns on the p-channel field effect transistor is a low-level voltage, and a gate-off voltage that turns off the p-channel field effect transistor is a high-level voltage.

The storage capacitor Cst includes a first electrode connected to the first node N1, and a second electrode connected to the second node N2. The data voltage Vdat is transmitted to the first node N1, and the storage capacitor Cst serves to maintain a voltage of the first node N1.

The light emitting diode LED includes an anode electrode connected to the second node N2, and a cathode electrode to which a second power source voltage ELVSS is applied. The light emitting diode LED may emit light with luminance that corresponds to a current supplied thereto from the pixel circuit 10. The light emitting diode LED may emit light of one of primary colors, or white light. In one embodiment, for example, primary colors are three primary colors, which are red, green, and blue. In one alternative embodiment, for example, primary colors are yellow, cyan, and magenta. The light emitting diode LED may be an organic light emitting diode OLED that includes a light emitting layer of an organic compound. Alternatively, the light emitting diode LED may be an inorganic light emitting diode including a light emitting layer of an inorganic compound.

During on-sensing, a scan signal of a gate-on voltage is applied to the scan line SCLn, and a data voltage Vdat of a predetermined level (i.e., a high-level voltage) is applied to the data line DLm. The data voltage Vdat of the predetermined level is applied to the gate electrode of the driving transistor TR1, and a current flows to the light emitting diode LED from the first power voltage ELVDD through the driving transistor TR1. In such an embodiment, a sensing signal of a gate-on voltage is applied to the sensing line SSLn and thus a voltage flowing to the light emitting diode LED is transmitted to the data driver 115 through the sensing transistor TR3.

Figure 3:
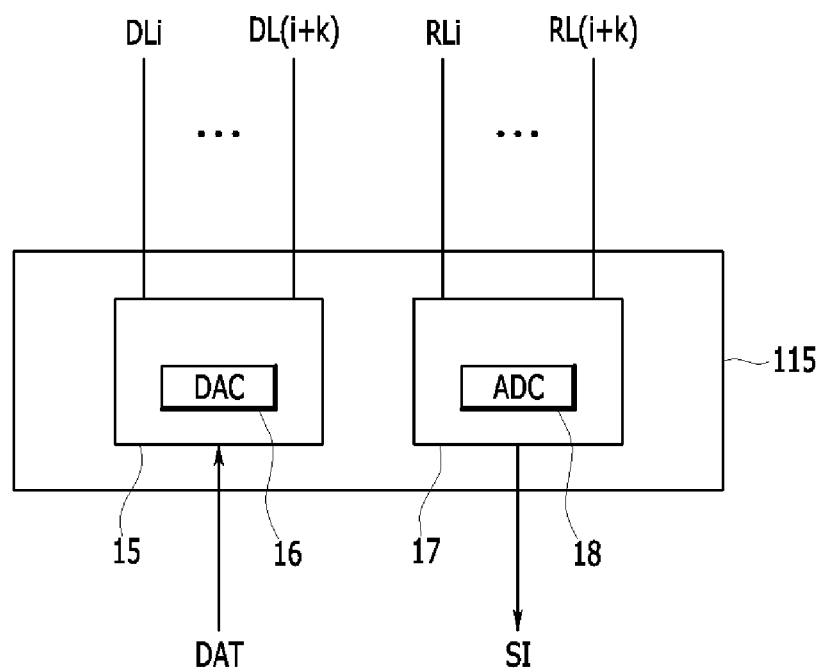
FIG. 3 is a block diagram of the data driver according to an embodiment of the invention.

FIG. 3 is a block diagram of the data driver according to an embodiment of the invention. A data driver 115 connected to the i-th to (i+k)-th data lines DLi to DL(i+k), among the data drivers 115 included in the display device of FIG. 1, will be described in detail for convenience of description.

Referring to FIG. 3, the data driver 115 includes a data voltage generator 15 and a sensing portion 17.

The data voltage generator 15 is connected to a plurality of data lines DLi to DL(i+k) that are connected to a plurality of pixels PX included in a block corresponding to the data driver 115. The data voltage generator 15 includes a digital-analog converter ("DAC") 16, receives an image data signal DAT from the timing controller 1000, and converts the image data signal DAT to a data voltage Vdat, which is an analog signal, by using the DAC 16, and applies the converted data voltage Vdat to the plurality of data lines DLi to DL(i+k).

The sensing portion 17 is connected to a plurality of receiving lines RLi to RL(i+k) that are connected to the plurality of pixels PX included in the block corresponding to the data driver 115. The sensing portion 17 includes an analog-digital converter ("ADC") 18, receives voltages flowing to the plurality of pixels PX through the plurality of receiving lines RLi to RL(i+k), and generates mobility sensing information SI by converting the voltage of the pixel PX to a digital signal by using the ADC 18. The mobility sensing information SI may contain mobility information of each of the plurality of pixels included in the block corresponding to the data driver 115. The sensing portion 17 transmits the mobility sensing information SI to the timing controller 1000.

In an embodiment, as described above, each data driver 115 generates mobility sensing information SI, and thus the timing controller 1000 may determine mobility sensing information SI for each data driver 115 or for each block. In such an embodiment, since the mobility sensing information SI contains mobility information of each of the plurality of pixels PX included in each block, the timing controller 1000 may determine mobility of each of the plurality of pixels PX and analyze distribution of mobility of each of the plurality of receiving lines RLi to RL(i+k).

Hereinafter, referring to FIG. 4, a structure of the timing controller 1000 that detects the first misalignment and the second misalignment based on the mobility sensing information SI will be described.

Figure 4:
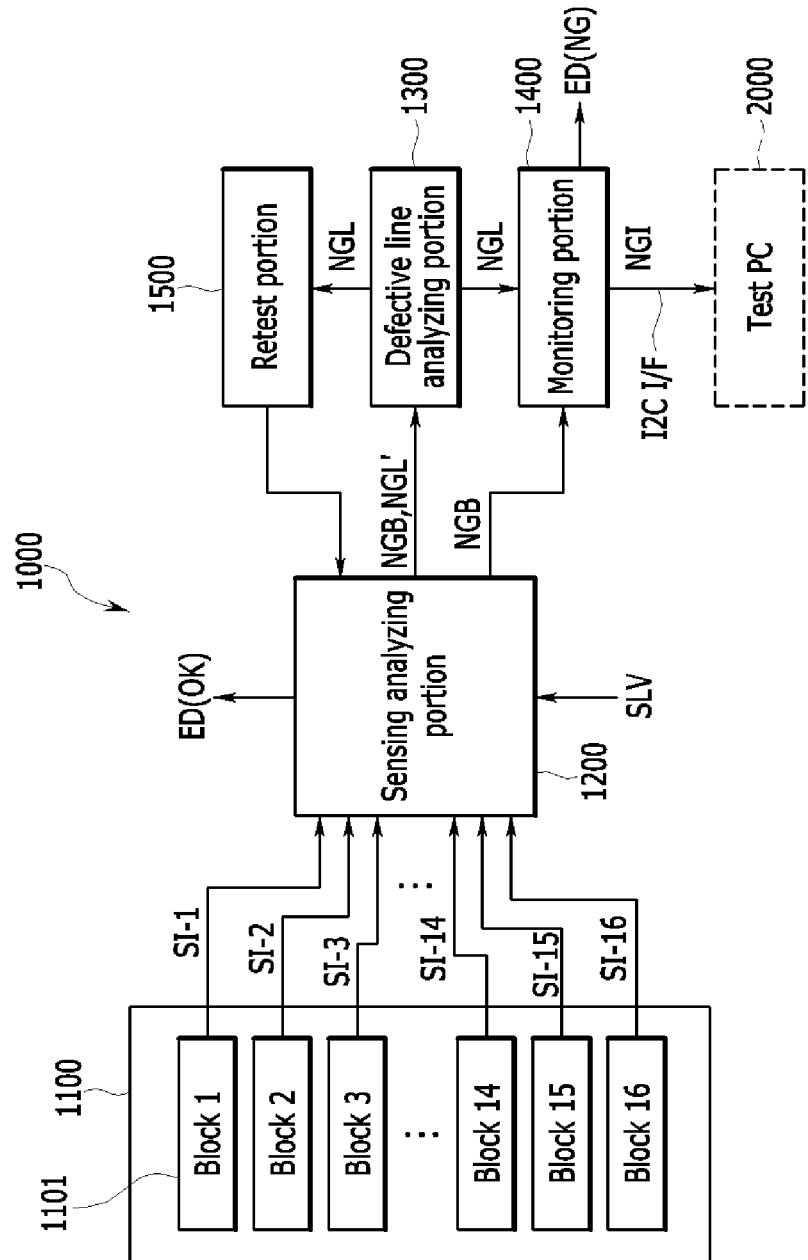
FIG. 4 is a block diagram of the timing controller according to an embodiment of the invention.

FIG. 4 is a block diagram of the timing controller according to an embodiment of the invention.

Referring to FIG. 4, an embodiment of the timing controller 1000 includes a frame memory 1100, a sensing analyzing portion 1200, a defective line analyzing portion 1300, a monitoring portion 1400, and a line retest portion 1500.

The frame memory 1100 stores mobility sensing information SI of a single frame, and includes a block-specific frame memory 1101. The block-specific frame memory 1101 is provided in plural to correspond to the plurality of data drivers 115, respectively, and each of the block-specific frame memories 1101 receives and stores mobility sensing information SI from a corresponding one of the plurality of data drivers 115. The block-specific frame memories 1101 may transmit the stored block-specific mobility sensing information SI-1, SI-2, SI-3, . . . , SI-14, SI-15, and SI-16 to the sensing analyzing portion 1200.

The sensing analyzing portion 1200 analyzes block-specific mobility distribution in each of the mobility sensing information SI-1, SI-2, SI-3, . . . , SI-14, SI-15, and SI-16, and compares each block-specific mobility distribution with a sensing allowable value SLV. The block-specific mobility distribution is a difference between the maximum value and the minimum value in block-specific mobility sensing information SI-1, SI-2, SI-3, . . . , SI-14, SI-15, and SI-16. The sensing allowable value SLV is predetermined by a manufacturer or a user.

When the block-specific mobility distribution is lower than the sensing allowable value SLV, the sensing analyzing portion 1200 determines that the misalignment has not occurred in the corresponding block, and outputs a first error detection signal ED(OK) that instructs a normal state. The timing controller 1000 drives the display device to control an image that may be normally displayed in response to the first error detection signal ED(OK).

When the block-specific mobility distribution is higher than the sensing allowable value SLV sensing analyzing portion 1200, the sensing analyzing portion 1200 determines that the first misalignment has occurred in the corresponding block and generates block defect information NGB for the corresponding block. The block defect information NGB may contain location information of the corresponding block or location information of a data driver 115 of the corresponding block.

When the block defect information NGB is received from the sensing analyzing portion 1200, the defective line analyzing portion 1300 compares line-specific mobility distribution in the block where the misalignment has occurred with the sensing allowable value SLV. The line-specific mobility distribution is a difference between the maximum value and the minimum value of each data line or each receiving line. The defective line analyzing portion 1300 analyzes whether a case where the line-specific mobility distribution is higher than the sensing allowable value SLV occurs only in a specific line or in all lines within a block. The defective line analyzing portion 1300 determines as first misalignment when the mobility distribution per line in all lines in the block is higher than the sensing allowable value SLV. The defective line analyzing portion 1300 determines that second misalignment has occurred when the mobility distribution per line is higher than the sensing allowable value SLV only for a specific line within the block.

The defective line analyzing portion 1300 generates line defect information NGL indicating first misalignment or second misalignment based on the determination result. The line defect information NGL may contain location information of a specific line of which mobility distribution is higher than the sensing allowable value SLV. The line defect information NGL is transmitted to a monitoring portion 1400 and a line retest portion 1500.

The monitoring portion 1400 is connected with an external test personal computer ("PC") 2000 through an interface (I2C I/F) such as inter-integrated circuit ("I2C"), receives block defect information NGB from the sensing analyzing portion 1200, receives line defect information NGL from the defective line analyzing portion 1300, and generates misalignment information NGI and outputs the misalignment information NGI to the test PC 2000. The misalignment information NGI may include location information of a block in which misalignment has occurred or location information of a data driver 115 corresponding to a corresponding block along with information on the first misalignment. Alternatively, the misalignment information NGI may include information on the second misalignment and the location information of the data line or receiving line where the misalignment has occurred.

The monitoring portion 1400 may output a second error detection signal ED(NG) that indicates misalignment corresponding to the misalignment information NGI. The second error detection signal ED(NG) is a signal indicating the occurrence of an error, and the output of the scan signal SC is stopped according to the second error detection signal ED(NG), and the power signal PE (shown in FIG. 1) is output to the power supply 300 to turn off the power of the display device.

When the line defect information NGL is received from the defective line analyzing portion 1300, the line retest portion 1500 performs re-measurement of the mobility of the pixel PX connected to the data line or the receiving line where misalignment has occurred. The line retest portion 1500 transmits location information of a data line or receiving line where the misalignment has occurred to the sensing analyzing portion 1200 in response to the line defect information NGL, and the sensing analyzing portion 1200 provides line failure information NGL', retested by analyzing mobility distribution for the corresponding line, to the defective line analyzing portion 1300. The defective line analyzing portion 1300 compares the retested line detect information NGL' with the previously-generated line defect information NGL to finally determine line detect information LNG when the two sets of information are equivalent to each other. The finally determined line defect information NGL is transmitted to the monitoring portion 1400.

When the retested line defect information NGL' and the previously generated line defect information NGL are different from each other, it is determined as the first misalignment, not the second misalignment. That is, when line misalignment is measured, irregularly different lines may have line defects due to misalignment between the display panel 100 and the first flexible printed circuit board 110.

Hereinafter, an embodiment of a method for detecting misalignment will be described in detail with reference to FIG. 5 to FIG. 7. A misalignment detection method of FIG. 5 to FIG. 7 may be performed by using the timing controller 1000 described above.

Figure 5:
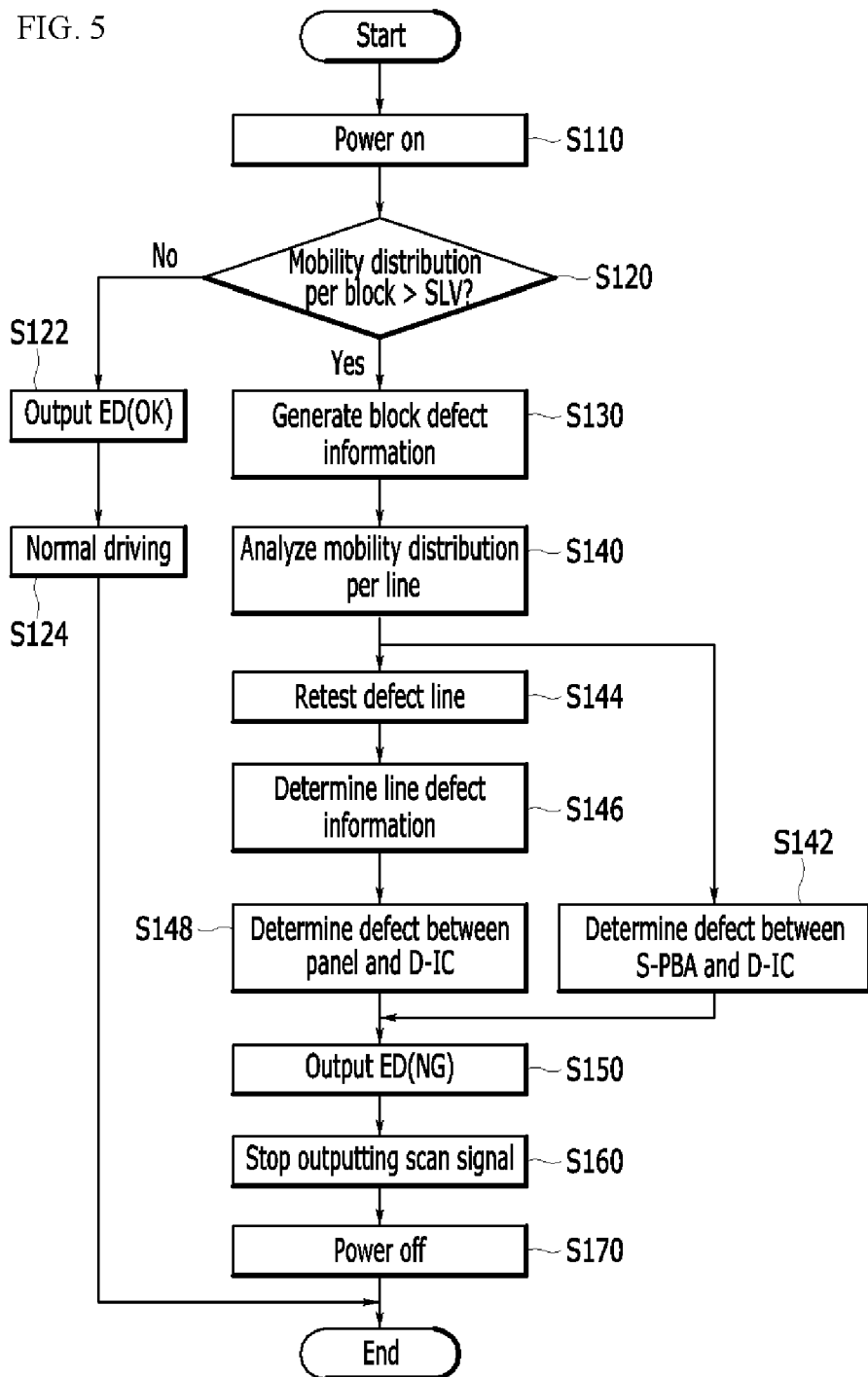
FIG. 5 is a flowchart of a driving method of the display device according an embodiment of the invention.

FIG. 5 is a flowchart of a driving method of the display device according an embodiment of the invention. FIG. 6 is a view for describing a connection failure between the flexible printed circuit and the data driver. FIG. 7 is a view for describing a connection failure between the display panel and the data driver.

Figure 6:
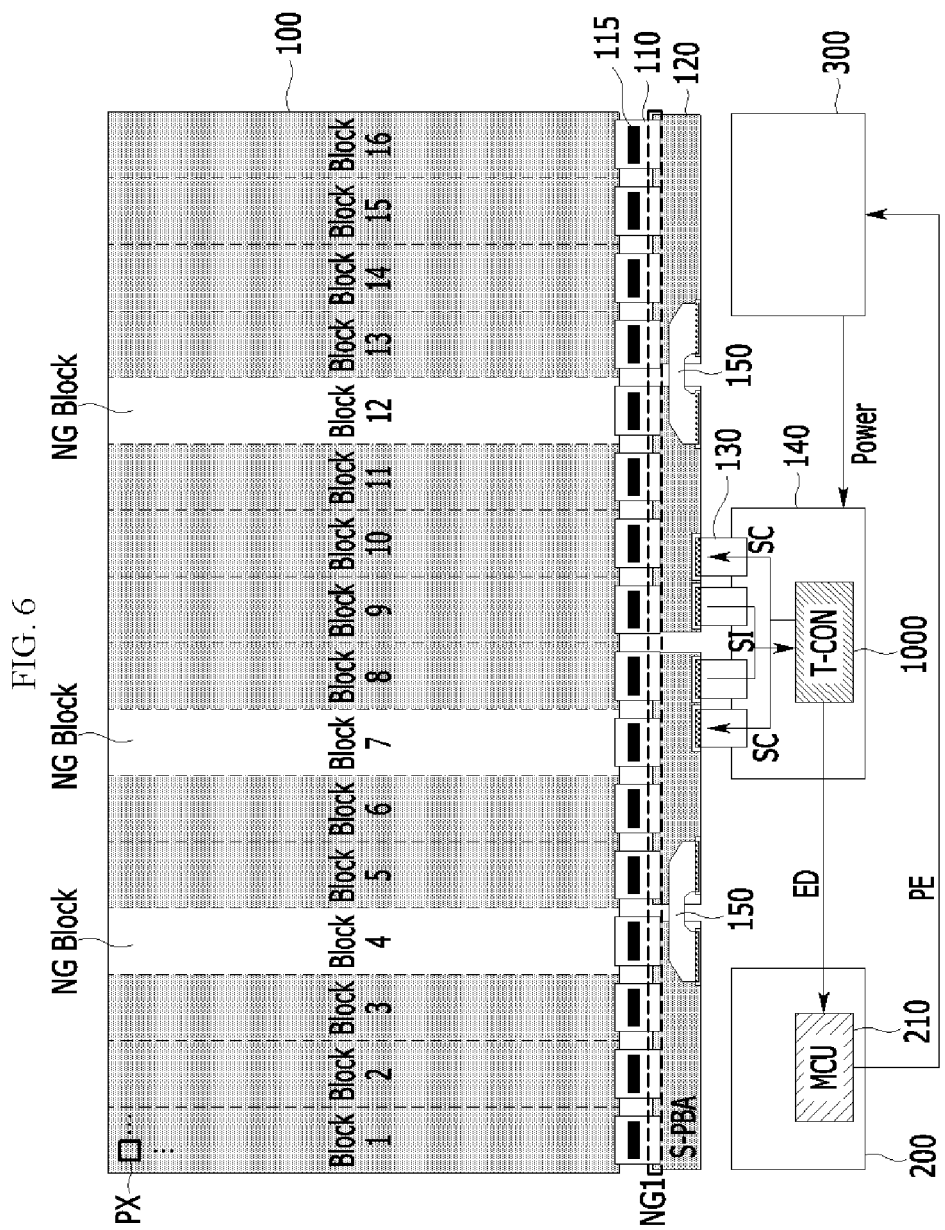
FIG. 6 is a view for describing a connection failure between the flexible printed circuit and the data driver.
Figure 7:
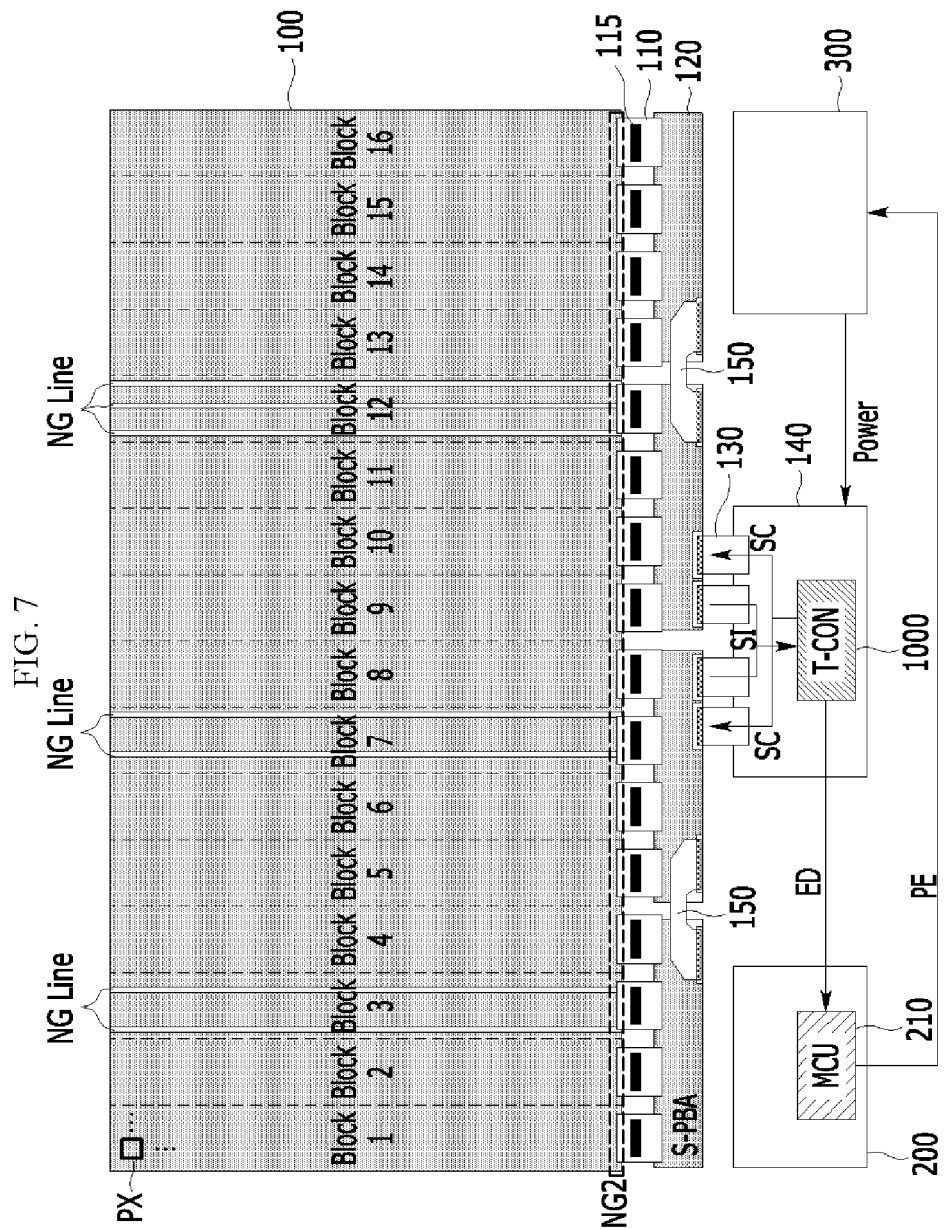
FIG. 7 is a view for describing a connection failure between the display panel and the data driver.

Referring to FIG. 5 to FIG. 7, when the display device is powered on (S110), on-sensing is performed until an image is displayed. During to the on-sensing, mobility sensing information SI of one frame may be obtained. The mobility sensing information SI may include mobility sensing information SI-1, SI-2, SI-3, . . . , SI-14, SI-15, and SI-16 for each block.

Mobility distribution for each block in the mobility sensing information SI-1, SI-2, SI-3, . . . , SI-14, SI-15, and SI-16 is analyzed, and it is determined whether the mobility distribution for each block is higher than the sensing allowable value SLV (S120). The block-specific mobility distribution is a difference between the maximum value and the minimum value in block-specific mobility sensing information SI-1, SI-2, SI-3, . . . , SI-14, SI-15, and SI-16.

When the block-specific mobility distribution is lower than the sensing allowable value SLV, it is determined that misalignment has not occurred in the corresponding block. When it is determined that misalignment has not occurred in all of the blocks, a first error detection signal ED(OK) indicating a normal state is output (S122).

According to the first error detection signal ED(OK), the display device normally drives to display an image (S124).

When the block-specific mobility distribution is higher than the sensing allowable value SLV sensing analyzing portion 1200, it is determined that the first misalignment has occurred in the corresponding block, and block defect information NGB for the corresponding block is generated (S130). That is, it is determined that first misalignment has occurred in a region NG1 between the first printed circuit board 120 and the first flexible printed circuit board 110. The block defect information NGB may contain location information of the corresponding block or location information of a data driver 115 corresponding to the block. As illustrated in FIG. 6, when it is determined that the fourth, seventh, and twelfth blocks are defect blocks NG block where mobility distribution is significantly higher than the sensing allowable value SLV, the block detect information NGB contains location information of the fourth, seventh, and twelfth blocks or location information of fourth, seventh, and twelfth data drivers 115.

It is analyzed whether a case where the mobility distribution per line is higher than the sensing allowable value SLV occurs only in a specific line or occurs in all lines within the block where the first misalignment has occurred (S140). The line-specific mobility distribution is a difference between the maximum value and the minimum value of each data line or each receiving line.

When the mobility distribution per line is higher than the sensing allowable value SLV in all lines within the block, it is determined that the first printed circuit board 120 and the first flexible printed circuit board 110 are misaligned (first misalignment) (S142). When the first misalignment is determined, misalignment information NGI including location information of the block in which the first misalignment has occurred or location information of the data driver 115 corresponding to the block may be output along with information about first misalignment, to an external test PC 2000.

When the mobility distribution per line is higher than the sensing allowable value SLV only for a specific line within the block, it is estimated than the display panel 100 and the first flexible printed circuit board 110 are misaligned (second misalignment), and first line defect information NGL is generated.

Mobility with respect to a pixel PX connected to a data line or receiving line where the second misalignment is estimated is retested (S144). Second line defect information NGL' is generated by analyzing and retesting mobility distribution for the corresponding line, and the previously-generated first line defect information NGL and the retested second line defect information NGL' are compared to finally determine the first line defect information NGL when the compared information are equivalent to each other (S146). That is, it is determined that second misalignment has occurred in a region NG2 between the display panel 100 and the first flexible printed circuit board 110. As illustrated in FIG. 7, when mobility distribution per line is significantly higher than the sensing allowable value SLV in specific lines in the fourth, seventh, and twelfth blocks and thus it is determined that the specific lines are defect lines NG Line, the line detect information NGL contains location information of the corresponding lines in the fourth, seventh, and twelfth data drivers 115.

According to the determined line defect information NGL, it is determined that the first printed circuit board 120 and the first flexible printed circuit board 110 are misaligned (second misalignment) (S148). When the second misalignment is determined, misalignment information NGI including location information of the data line or receiving line in which the second misalignment has occurred may be output along with information about second misalignment, to the external test PC 2000.

When the first misalignment or second misalignment is determined, a second error detection signal ED(NG) that indicates misalignment is output (S150).

The second error detection signal ED(NG) is a signal indicating the occurrence of an error, and the output of the scan signal SC is stopped in response to the second error detection signal ED(NG) (S160).

In such an embodiment, the power signal PE instructing the power off from the MCU 210 is output to the power supply 300 to turn off the power supplied to the display device (S170).

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:
1. A display device comprising:
a display panel including a plurality of pixels and a receiving line;
a first flexible printed circuit board attached to the display panel and electrically connected to the display panel;
a first printed circuit board attached to the first flexible printed circuit board and electrically connected to the first flexible printed circuit board;
a data driver electrically connected to the display panel; and
a timing controller electrically connected to the data driver, wherein
a pixel of the plurality of pixels comprises a light emitting element, and a sensing transistor connected to the light emitting element and the receiving line,
the data driver comprises a data voltage generator for applying data voltages to the plurality of pixels, and a sensing portion connected to the receiving line to receive a voltage from the pixel and generate mobility sensing information based on the voltage from the pixel, and
the timing controller comprises a memory for receiving the mobility sensing information, and an analyzing portion for determining a first misalignment between the first printed circuit board and the first flexible printed circuit board, or a second misalignment between the display panel and the first flexible printed circuit board, based on the mobility sensing information.

2. The display device of claim 1, wherein
the timing controller is configured to output an error detection signal indicating an occurrence of an error when one of the first misalignment and the second misalignment is detected, and
the timing controller is configured to stop outputting of a scan signal applied to the plurality of pixels in response to the error detection signal.

3. The display device of claim 2, further comprising:
a power supply for supplying a power to the display device, and turning off the power in response to the error detection signal.

4. The display device of claim 1, wherein
the memory is configured to store mobility sensing information for a block of the display panel corresponding to the data driver;
the analyzing portion comprises:
a sensing analyzing portion for analyzing mobility distribution per block for the block based on the mobility sensing information; and
a defective line for analyzing portion analyzing mobility distribution per line for every data line connected to the data driver.

5. The display device of claim 4, wherein the sensing analyzing portion is configured to determine that the first misalignment occurs in the block when the mobility distribution for the block is higher than a predetermined sensing allowable value.

6. The display device of claim 4, wherein the defective line analyzing portion is configured to determine that the second misalignment occurs when a case where the mobility distribution per line is higher than a predetermined sensing allowable value occurs only in a specific line.

7. The display device of claim 6, wherein the timing controller further comprises a line retest portion for re-performing a mobility measurement for the specific line.

8. The display device of claim 4, wherein the timing controller further comprises a monitoring portion for outputting misalignment information including location information of a data driver where misalignment occurs along with information on the first misalignment.

9. The display device of claim 8, wherein the monitoring portion is configured to output misalignment information including location information of a data line where misalignment occurs along with information on the second misalignment.

\* \* \* \* \*